United States Patent
Nicollini et al.

(10) Patent No.: US 6,977,544 B2
(45) Date of Patent: Dec. 20, 2005

(54) BOOSTED SAMPLING CIRCUIT AND RELATIVE METHOD OF DRIVING

(75) Inventors: Germano Nicollini, Piacenza (IT); Carlo Pinna, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/879,485

(22) Filed: Jun. 29, 2004

(65) Prior Publication Data

US 2005/0017793 A1  Jan. 27, 2005

(30) Foreign Application Priority Data

Jul. 3, 2003  (EP) .................................. 03425439

(51) Int. Cl.[7] ......................... H03M 1/00; G01C 27/02
(52) U.S. Cl. ........................................ 327/589; 327/91
(58) Field of Search .................................. 327/589, 91

(56) References Cited

U.S. PATENT DOCUMENTS 6,724,236 B1 * 4/2004 Sarraj ........................... 327/390
6,833,753 B2 * 12/2004 Das .............................. 327/536

FOREIGN PATENT DOCUMENTS

EP  1122741  8/2001  ........... G11C 27/02
EP  1168619  1/2002  ........... H03K 17/06

OTHER PUBLICATIONS

Fayomi et al., low-Voltage CMOS Analog Switch for High Precision Sample-and-Hold Circuit, Proceedings of the 43rd IEEE Midwest Symposium on Circuits and Systems, Proceedings of the 43rd IEEE Midwest Symposium on Circuits and Systems, Lansing, MI, USA, Aug. 8-11, 2000, Piscataway, NJ, USA, pp. 710-713, vol. 2 XP002265037.

Sonkusale et al., A Low Distortion MOS Sampling Circuit, 2002 IEEE International Sympoisum on Circuits and Systems, Proceedings, 2002 IEEE International Symposium on Circuits and Systems, Phoenix-Scottsdale, AZ, USA, May 26-29, 2002, Piscataway, NJ, USA, IEEE, pp. V-585-V-588, vol. 5, XP002265038.

* cited by examiner

*Primary Examiner*—My-Trang Nu Ton
(74) *Attorney, Agent, or Firm*—Lisa K. Jorgenson; Allen, Dyer, Doppelt, Milbrath & Gilchrist, P.A.

(57) ABSTRACT

A boosted sampling circuit that is relatively straightforward to form is provided, as well as a corresponding method for driving the same. The input voltage applied to the boosted sampling circuit may be equal to a supply voltage or may be greater than a maximum voltage level allowed by the prior art circuits. This result is attained by connecting the control nodes of a plurality of switches to the input node while a first control phase is active, and by connecting a current terminal of another switch to a biasing voltage for protecting it from breakdowns.

22 Claims, 6 Drawing Sheets

FIG. 9 ically constant.
BOOSTED SAMPLING CIRCUIT AND RELATIVE METHOD OF DRIVING

FIELD OF THE INVENTION

The present invention relates to sampling circuits, and more particularly, to a boosted sampling circuit and a corresponding method for driving the same that ensures a large range of variation of the input signal.

BACKGROUND OF THE INVENTION

Analog/digital conversion systems can be subdivided into two main categories according to the conversion principle on the basis of which they operate. The first category is based upon Nyquist analog/digital conversion systems, whereas the second category is based upon over-sampling analog/digital conversion systems.

Figure 1:
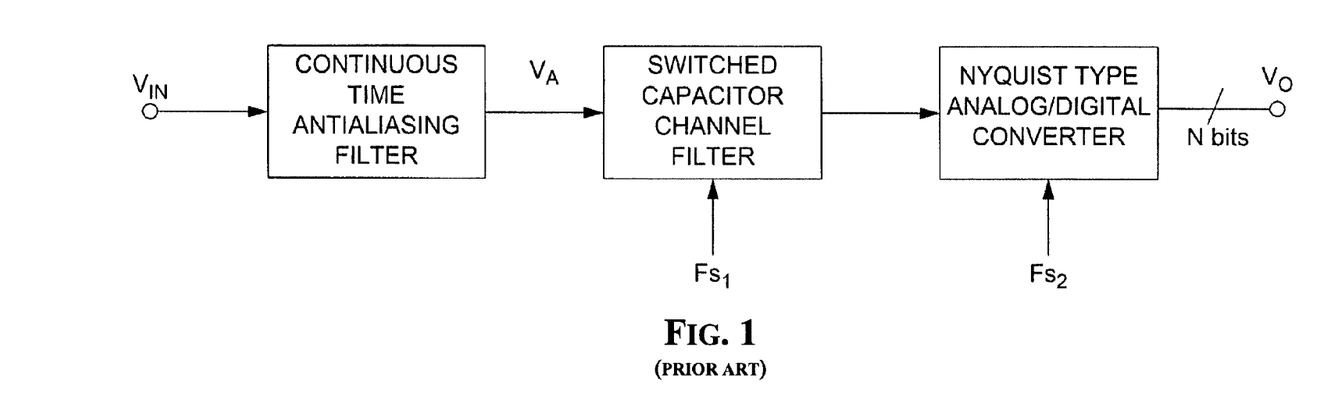
FIG. 1 is an analog-to-digital Nyquist converter in accordance with the prior art.
Figure 2:
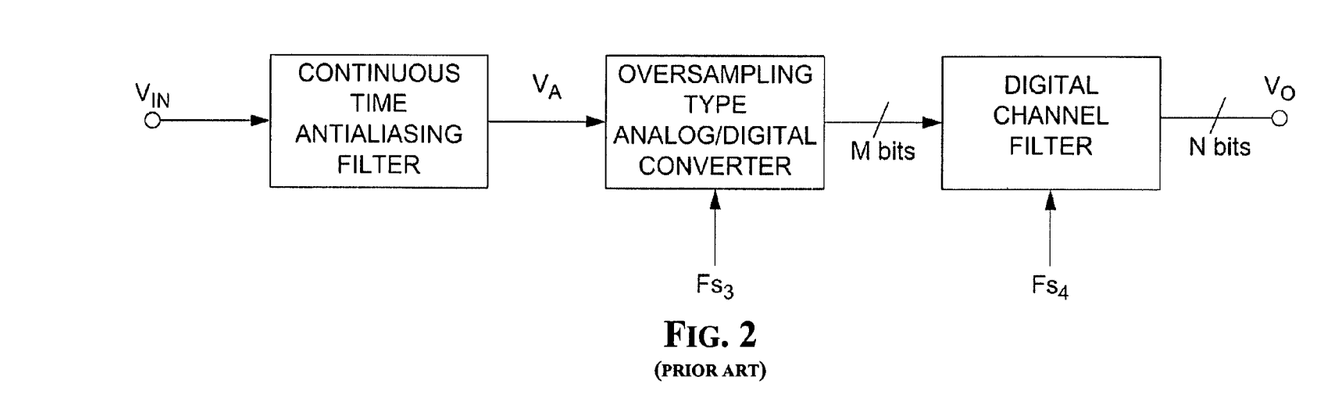
FIG. 2 is an analog-to-digital oversampling converter in accordance with the prior art.

A Nyquist analog/digital conversion system, as depicted in FIG. 1, is substantially composed of a continuous time anti-aliasing filter, a switched-capacitor channel filter operating at a frequency $F_{S1}$, and a Nyquist analog/digital converter operating at a frequency $F_{S2}$. The filters and the converter are connected in cascade. An over-sampling analog/digital conversion system is depicted in FIG. 2 and comprises a cascade connection of a continuous-time anti-aliasing filter, an over-sampling analog/digital converter operating at a frequency $F_{S3}$, and a digital channel filter operating at a frequency $F_{S4}$. In both systems, the signal $V_A$ should be sampled before being processed by the switched capacitor channel filter or by the over-sampling converter.

Figure 3:
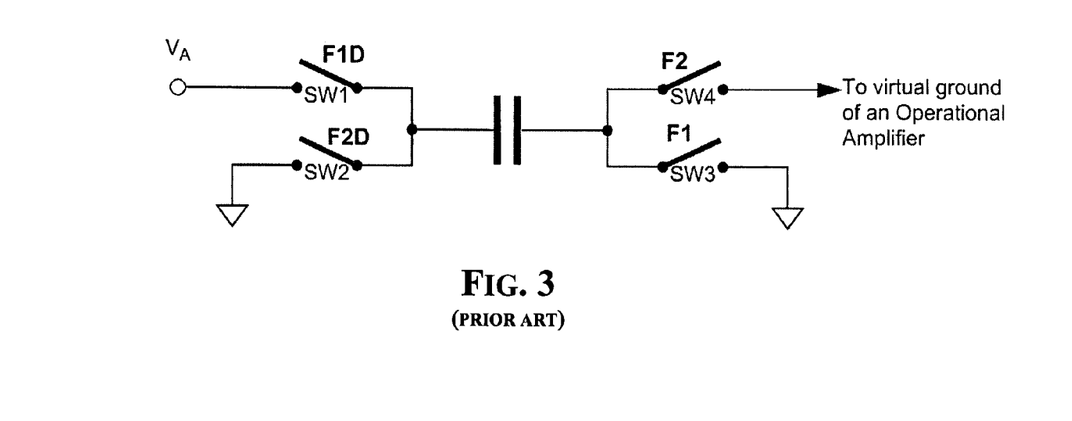
FIG. 3 is a general circuit scheme of a sampling circuit in accordance with the prior art.

FIG. 3 shows the general circuit diagram of a commonly used sampling circuit. In particular, the sampling circuit comprises an input terminal at which an analog input voltage $V_A$ to be sampled is present, and an output terminal on which a corresponding sampled current is provided. The plates of a sampling capacitor are alternatively connected to the input or output nodes and to a ground node by four switches SW1, SW2, SW3 and SW4.

When the switches SW1 and SW3 are on and the switches SW2 and SW4 are off, the voltage $V_A$ is sampled and stored in the capacitor. In the opposite situation the sampled current is output, typically towards the virtual ground of an operational amplifier. The switches SW1, SW2, SW3 and SW4 are not ideal and have parasitic capacitances that introduce an undesired distortion. As a consequence, this significantly reduces the performances of the sampler.

To address this problem, in "Low-Distortion Switched-Capacitor Filter Design Techniques", Kuang-Lu Lee and Robert G. Mayer, IEEE Journal of Solid-State Circuits, vol. sc-20, No. 6, December 1985, Section III B, pages 1103–1112, a technique of controlling the four switches with the control phases F1, F2, F1D, F2D shown in FIG. 4 has been proposed.

Figure 4:
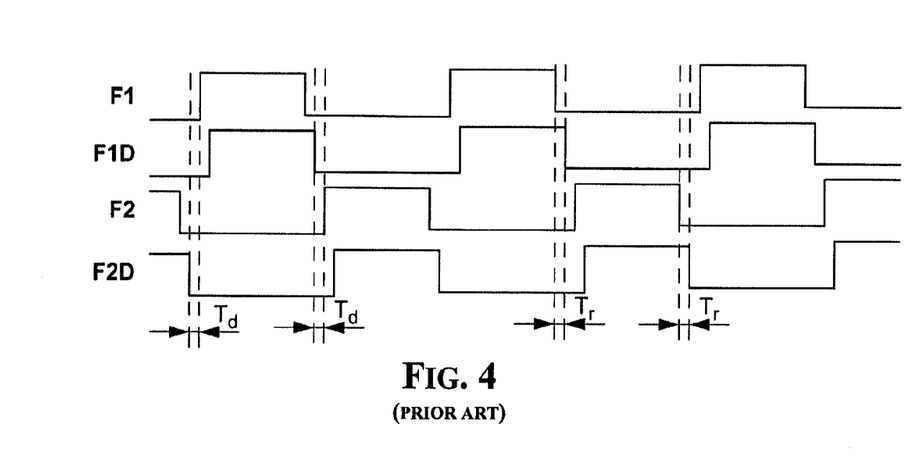
FIG. 4 is a timing diagram of control phases for the sampling circuit of FIG. 3.

The high logic values of the control phases F1 and F2 are separated by a blanking time $T_D$. This prevents short-circuits to ground. The control phases F1D and F2D are generated by delaying the control phases F1 and F2, respectively, by a time $T_R$ of a few nanoseconds. Moreover, the control phases F1D and F2 and the control phases F2D and F1 do not overlap one another.

According to the logic levels assumed by the control signals F1, F2, F1D and F2D, the sampling capacitor is connected alternately between the input node and the ground node, and between the latter and the output node. When the first and the fourth control signals F1, F1D assume a high logic level, the input voltage $V_A$ is sampled and the sample is stored in the sampling capacitor. When the second and the third control signals F2, F2D assume a high logic level, the sample of the input voltage $V_A$ stored in the sampling capacitor is transferred to the output node, and is sent to an operational amplifier.

As demonstrated in the above mentioned article, by using the structure shown in FIG. 3 and the control phases shown in FIG. 4, the distortion of the output signal is significantly reduced if the maximum frequency of the input voltage $V_A$ is smaller than 10 kHz.

However, at high frequencies, and in particular, at input frequencies greater than 100 kHz, the distortions are intolerable and the technique proposed in the above mentioned article is not sufficient. This is clearly demonstrated in the paper "A Cascaded Sigma-Delta Pipeline A/D Converter With 1.25 MHz Signal Bandwidth And 89 dB SNR", T. L. Brooks et al., IEEE Journal Solid-State Circuits, vol. 32, No. 12, December 1997, Section IV B, pages 1896–1905.

Figure 5:
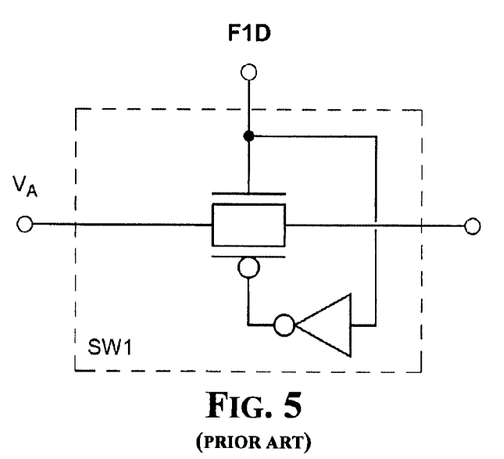
FIG. 5 is a switch used for sampling an input voltage in accordance with the prior art.
Figure 6:
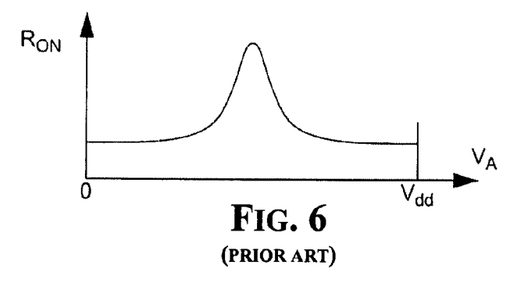
FIG. 6 shows variations of the on-resistance of the switch of FIG. 5 as a function of the input voltage.

According to the prior art, the sampling switch SW1 is usually implemented by a CMOS transfer-gate as shown in FIG. 5. As explained in the above mentioned article, this sampling switch has a series resistance that varies considerably as a function of the input voltage $V_A$, as shown in FIG. 6. This causes strong distortions for input voltages $V_A$ at high frequency.

Figure 7:
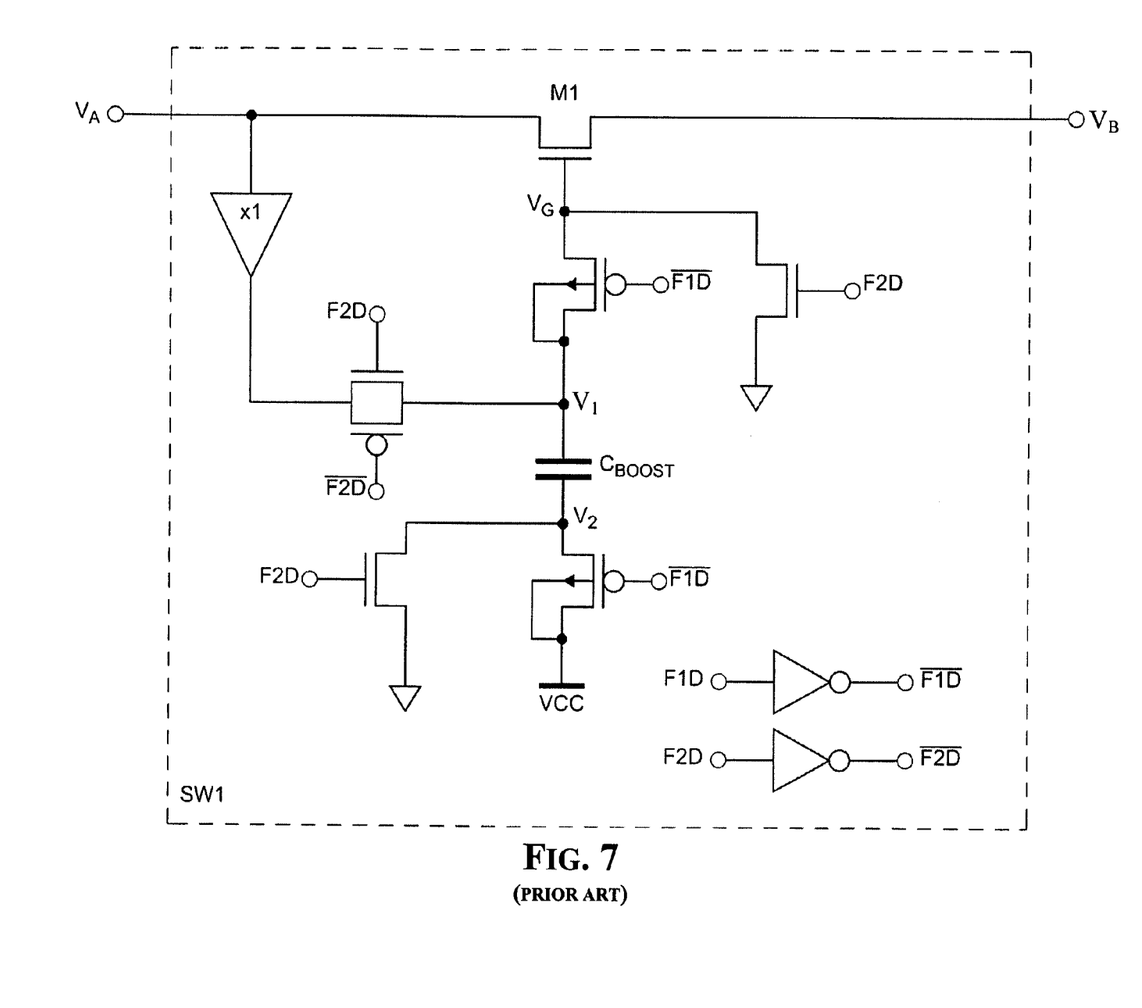
FIG. 7 is a circuit diagram of a sampling circuit in accordance with the prior art.

To overcome these drawbacks, the sampling circuit shown in FIG. 7, commonly known as "bootstrapped clock-boosted switch", is proposed. In particular, the sampling circuit, bordered by a dashed rectangle, comprises an NMOS transistor M1. The current terminals of the NMOS transistor M1 are the input and the output nodes of the sampling circuit, and the control node of the NMOS transistor M1 is coupled to a boost capacitor $C_{BOOST}$ through a PMOS transistor controlled by the inverted replica $\overline{F1D}$ of the control phase F1D.

A plate of the capacitor $C_{BOOST}$ is charged with the input voltage $V_A$ through a voltage buffer during the control phase F2D. This is while the other plate is connected to a ground node during the control phase F2D, and to the supply $V_{CC}$ during the control phase F1D.

When F2D is active, the gate of the switch M1 is connected to ground (M1 is off), the voltage $V_2$ is null and the voltage $V_1$ is the input voltage $V_A$. When the control phase F1D is active (and thus F2D is inactive), the voltage $V_2$ is the supply voltage, the voltage $V_1$ is $$V_1 = V_A + V_{CC}$$

and is applied to the gate node of the switch M1. Therefore, the switch M1 is on and its gate-source voltage equals the supply voltage $V_{CC}$ (boot-strap effect on the gate-source voltage).

The gate-source voltage of the switch M1 does not depend on the input voltage $V_A$. Thus, the on-resistance $R_{ON}$ of switch M1, which is a function of the difference between the gate-source voltage and its threshold voltage $V_T$, is substantially constant.

A first limitation of the sampling circuit of FIG. 7 is that the bandwidth of the input voltage $V_A$ should be limited to frequencies which are much smaller than the sampling frequency. Otherwise, variations of the input voltage $V_A$ when the first control phase F1D is logically high and the second control signal F2D is logically low are too large. As a consequence, the gate-source voltage of the switch M1 could not be considered substantially equal to the supply voltage $V_{CC}$. Therefore, all the advantages of the switching circuit described in the above mentioned article would be lost.

The sampling circuit thus needs a sampling frequency far greater than the Nyquist sampling frequency which results in a waste of power and a waste in silicon area. It should be remembered that, according to the well-known Nyquist theorem, no information is lost when sampling a signal VA if the sampling frequency is at least twice the maximum frequency of the signal $V_A$ to be sampled.

A second limitation is when the first control signal F1D is logically active, the voltages $V_G$ and $V_1$ could exceed the maximum voltage allowed by the technology used for fabricating the circuit. For example, in a 0.5 μm technology, the maximum operating voltage that can be withstood by integrated devices is equivalent to 4.6 V, and typically the supply voltage $V_{CC}$ is 3.3 V.

Given that the maximum level $V_{GMAX}$ of the voltage $V_G$ (or $V_1$) is $$V_{GMAX}=V_{CC}+V_{AMAX}$$

where $V_{AMAX}$ is the maximum voltage level of the input signal $V_A$ to be sampled, then $$V_{AMAX} \leq 1.3V$$

and this leads to a significant loss of signal/noise ratio of the A/D converter in which the sampling circuit is integrated.

Figure 8:
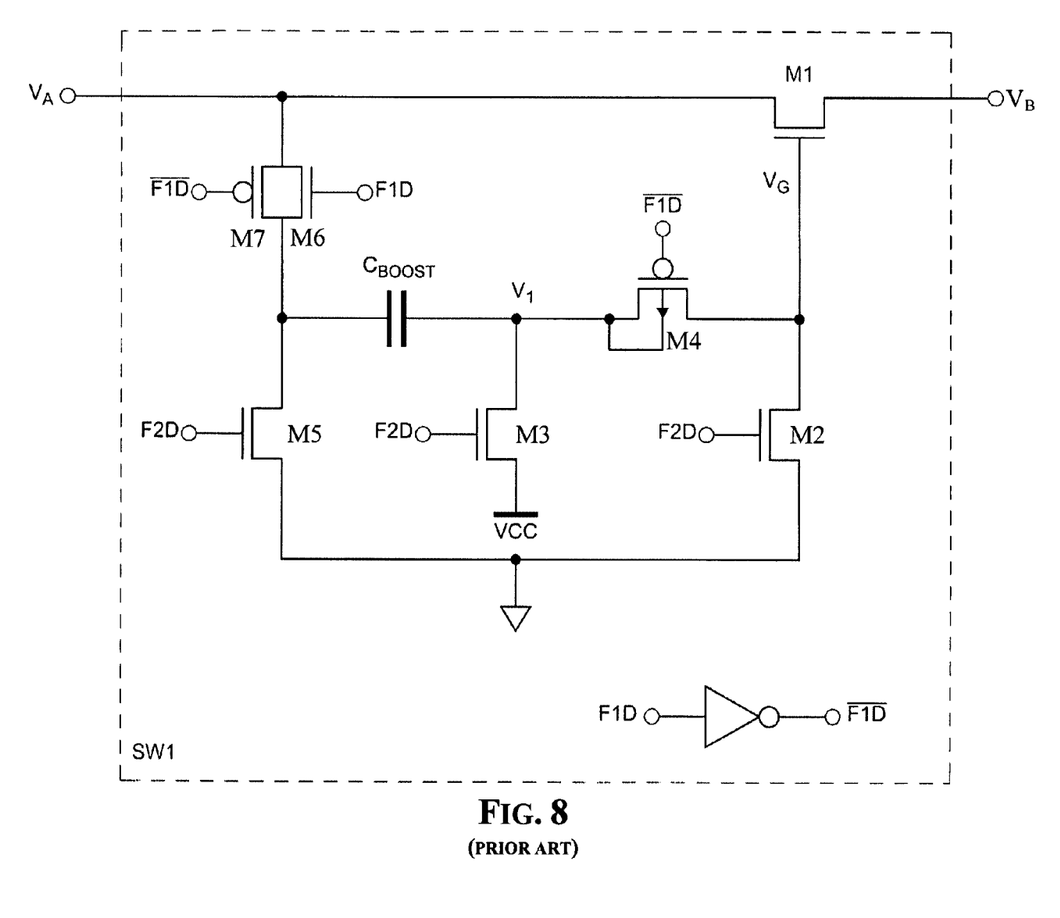
FIG. 8 is a diagram of the sampling circuit disclosed in U.S. Pat. No. 6,518,901 in accordance with the prior art.

A boosted sampling circuit that overcomes the drawbacks of the circuit of FIG. 7 is proposed in U.S. Pat. No. 6,518,901, as shown in FIG. 8. The '901 patent is incorporated herein by reference in its entirety, and is assigned to the current assignee of the present invention.

Like the circuit of FIG. 7, the switch M1 is on during the phase F1D and is off during the phase F2D. In contrast, when the control phase F2D is active, the capacitor $C_{BOOST}$ is connected between the supply $V_{CC}$ and ground. The plate connected to the transistor M3 is thus at the potential $$V_{CC}-V_T.$$

When the control phase F1D is active, the other plate of the capacitor is charged with the input voltage $V_A$ making the voltage $V_1$ equal to $$V_1=V_{CC}-V_T+V_A.$$

In so doing, the gate-source voltage of the switch M1 is constant and equal to $$V_{CC}-V_T.$$

The main difference between this switching circuit and the circuit of FIG. 7 is that the voltage $V_A$ is applied to a plate of the capacitor at the same time in which it is sampled by the switch M1. Therefore, the limitations on the frequency of the input signal are overcome.

Moreover, the maximum voltage $V_{GMAX}$ is $$V_{GMAX}=V_{CC}-V_T+V_{AMAX}$$

thus, if $$V_{GMAX} \leq 4.6 \text{ V}; V_{CC}=3.3 \text{ V}; V_T=1.0 \text{ V}$$

the maximum level of the input voltage is $$V_{AMAX} \leq 2.3 \text{ V}.$$

Unfortunately, even this circuit is not very efficient with the most advanced technologies. In fact, in a 0.35 μm technology the maximum admissible voltage is 3.6 V and thus the maximum level of the input voltage now is $$V_{AMAX} \leq 1.3 \text{ V}$$

and the signal/noise ratio is consequently reduced.

U.S. Pat. No. 6,072,355 to J. L. Bledsoe discloses a bootstrap sample and hold circuit for acquiring and holding values of a high frequency analog input voltage. This circuit differs from the circuit of FIG. 8 because it has a node at a certain reference voltage that can never be the supply voltage. For this reason the circuit of the above mentioned patent needs an additional circuit for generating this reference voltage.

U.S. Pat. No. 6,323,697 to S. Pavan discloses a circuit that can be used as a low distortion sample and hold device of an input voltage. Even this circuit is affected by the drawback of requiring additional circuitry which is not present in the circuit of FIG. 8.

SUMMARY OF THE INVENTION

In view of the foregoing background, an object of the present invention is to provide a boosted sampling circuit that is relatively straightforward to form, and one in which the input voltage may be greater than the maximum voltage level $V_{AMAX}$ allowed by prior art circuits, such as the prior art circuit illustrated in FIG. 8. The input voltage may even be equal to the supply voltage.

Investigations on the functioning of the sampling circuit in accordance with the present invention demonstrated that the voltage drops on the nodes of only three of the switches may exceed the supply voltage, while this does not happen on the other switches. More particularly, the transistors M2, M3 and M4 withstand the largest voltage drops, which are equal to $V_{CC}-V_T+V_A$, while the control phase F1D is active.

The cause of this is attributed to the fact that at least one node of these switches is at a ground potential, which determines such a large voltage drop. Indeed, for the circuits described in U.S. Pat. No. 6,518,901, it was considered necessary to ground the control nodes of the switches M2, M3 and M4 and a current terminal of the switch M2 while the control phase F1D is active for switching off switches M2 and M3 and for switching on switch M4. It has now been found that it is not really necessary nor efficient to do so.

According to the present invention, the control nodes of the switches M2, M3 and M4 may be connected to the input node while the control phase F1D is active. A current terminal of the transistor M2 may be connected to a certain voltage for protecting it from breakdowns.

The boosted sampling circuit in accordance with the present invention comprises having a controlled switch sampling an input voltage and generating a corresponding sampled voltage. A control circuit may generate a control voltage for the sampling switch as a function of the input voltage.

The boosted sampling circuit comprises a boost capacitor, a plate of which may be alternately charged with the input voltage or with a reference voltage through the second and third switches, respectively. This is controlled by respective first and second logic control phases. The other plate may be alternately charged with a supply voltage through a fourth switch in a conduction state. The fourth switch is in a conduction state when the second phase is active or connected to a control node of the sampling switch through a fifth switch in a conduction state. The fifth switch may be in a conduction state when the first control phase is logically active. A sixth switch may be in a conduction state when the second control phase is active for turning off the sampling switch by connecting the control node thereof to a node having a certain voltage applied thereto.

The control phases used in the circuit are not logically active at the same time. The boosted sampling circuit overcomes the limitations of the known circuits because it comprises a circuit for applying the input voltage to the control terminals of the fourth, fifth and sixth switches when the first control phase is logically active. Certain voltages are generated to keep the voltage drops on the nodes of the sixth switch smaller than the supply voltage when the first control phase is logically active.

BRIEF DESCRIPTION OF THE DRAWINGS

The different aspects and advantages of the invention will appear even more evident through a detailed description referring to the accompanying drawings, wherein.

DETAILED DESCRIPTION OF THE PREFERRED EMBODIMENTS

As stated before, in the known circuit of FIG. 8, the transistors M2, M3 and M4 withstand the largest voltage drops ($V_{CC}-V_T+V_A$) during the active control phase F1D, while the voltage drops on the other switches do not overcome the supply voltage $V_{CC}$.

According to the present invention, it is possible to increase the variation range of the input signal $V_A$ by applying certain voltages to the nodes of the switches M2, M3 and M4 through a dedicated circuit during the control phase F1D. This is done to prevent the voltage drops at their nodes from becoming greater than the supply voltage without unduly turning on or off these switches.

Figure 9:
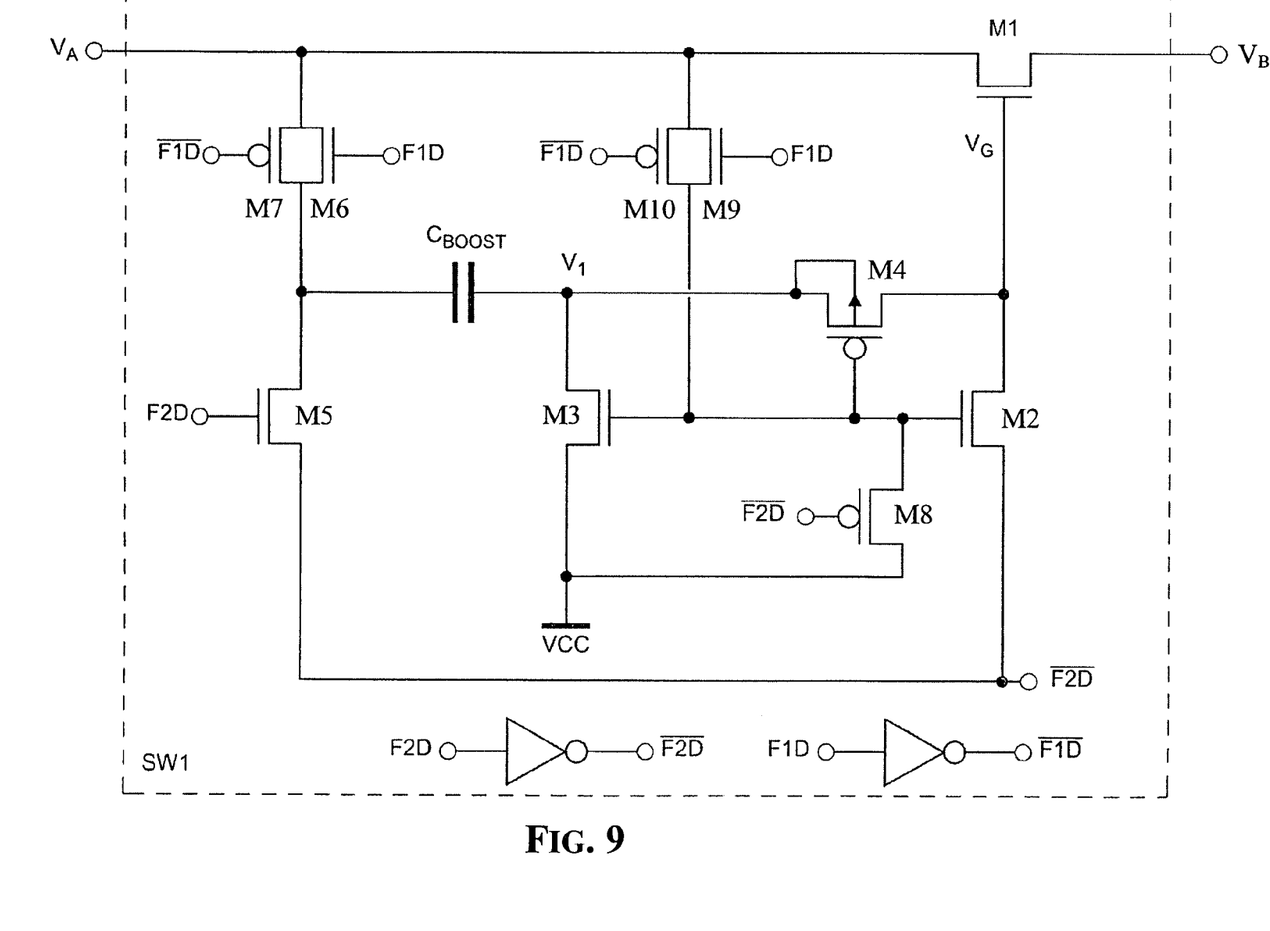
FIG. 9 is the preferred embodiment of the sampling circuit in accordance with the present invention.

FIG. 9 depicts a preferred embodiment of the sampling circuit in accordance with the present invention. This circuit differs from the known circuit of FIG. 8 because it comprises the switches M9, M10 and M8. In addition, a current terminal of the transistor M2 is not connected to ground but to a node biased by an inverted replica of the control phase F2D.

When the first control phase F1D is active, the voltage V1 equals the sum between the input voltage $V_A$ and the supply voltage $V_{CC}$, but the switches M9, M10 bias the gates of the transistors M2, M3 and M4 with the input voltage $V_A$. As a result, the voltage drops on the transistors M3 and M4 do not exceed the supply voltage.

According to one aspect of the invention the voltage drop on the transistor M2 is made smaller than the supply voltage during the first control phase F1D by biasing the current terminal of M2 that is not connected to the gate node of the switch M1. The bias is a certain voltage while the second control phase is inactive. This keeps the drain-source voltage of the transistor M2 smaller than the supply voltage. As shown in FIG. 9, this current terminal of M2 may be effectively biased with the inverted replica of the second control phase F2D.

As an alternative, this current terminal of M2 may be biased with the first control phase F1D or with any other voltage that makes the voltage drops on the transistor M2 smaller than the supply voltage $V_{CC}$. As an option, the current terminal of the transistor M5 that is not connected to the boost capacitor may be connected in common with the current terminal of the transistor M2 biased by the inverted replica of the second control phase F2D, instead of being connected to ground.

It is possible to demonstrate that in the boosted sampling circuit of the invention, the maximum voltage drop on the transistors M2, M3 and M4 remains smaller than the supply voltage even if the input voltage $V_A$ equals $V_{CC}$. In fact, the maximum drain-source voltage on the transistor M2 is attained during the active control phase F1D, and is $$V_{CC}-V_T+V_A-V_{CC}=V_A-V_T$$

which is smaller than the supply voltage if $V_A \leq V_{CC}$, while the gate-source voltage of transistors M2, M3 and M4 is $$V_{CC}-V_T+V_A-V_A=V_{CC}-V_T.$$

The boosted sampling circuit of the invention is capable of sampling input voltages that may even equal the voltage $V_{CC}$ without making the voltage drop on any transistor surpass the supply voltage. Therefore, for 0.35 μm technology the maximum admissible level of the input voltage is 3.6 V, which is almost three times greater than the maximum admissible level for the known sampling circuit of FIG. 8.

That which is claimed is:

1. A method for driving a boosted sampling circuit comprising an input node and an output node, a sampling switch connected to the input node for sampling an input voltage and for generating a corresponding sampled voltage on the output node, and a control circuit for generating a control voltage for the sampling switch as a function of the input voltage, the control circuit comprising a boost capacitor comprising first and second plates, the method comprising:

alternately charging the first plate of the boost capacitor with the input voltage and with a reference voltage using second and third switches, the second and third switches being respectively controlled by first and second logic control phases that are not active at a same time;

alternately charging the second plate of the boost capacitor with a supply voltage using fourth and fifth switches, the fourth switch charging the second plate during a conduction state when the second logic control phase is active, and the fifth switch charging the second plate when connected to a control terminal of the sampling switch during a conduction state when the first logic control phase is active;

turning off the sampling switch using a sixth switch by connecting the control terminal of the sampling switch to a voltage node having a certain voltage applied thereto, the sixth switch turning off the sampling switch during a conduction state when the second logic control phase is active;

applying the input voltage to control terminals of the fourth, fifth and sixth switches when the first logic control phase is active; and generating the certain voltage so that a voltage drop on the voltage node is less than the supply voltage when the first logic control phase is active.

2. A method according to claim 1, wherein the certain voltage is an inverted replica of the second logic control phase.

3. A method according to claim 1, wherein the reference voltage is an inverted replica of the second logic control phase.

4. A method according to claim 1, wherein the fourth and sixth switches each comprise NMOS transistors, the fifth switch comprises a PMOS transistor.

5. A method for driving a boosted sampling circuit comprising an input node and an output node, a sampling switch connected to the input node for sampling an input voltage and for generating a corresponding sampled voltage on the output node, and a control circuit for generating a control voltage for the sampling switch as a function of the input voltage, the control circuit comprising a boost capacitor comprising first and second plates, the method comprising:

alternately charging the first plate of the boost capacitor with the input voltage and with a reference voltage using second and third switches, the second and third switches being respectively controlled by first and second logic control phases;

alternately charging the second plate of the boost capacitor with a supply voltage using fourth and fifth switches, the fourth switch charging the second plate during a conduction state when the second logic control phase is active, and the fifth switch charging the second plate during a conduction state when the first logic control phase is active;

turning off the sampling switch using a sixth switch by connecting a control terminal of the sampling switch to a voltage node having a certain voltage applied thereto, the sixth switch turning off the sampling switch during a conduction state when the second logic control phase is active;

applying the input voltage to control terminals of the fourth, fifth and sixth switches when the first logic control phase is active; and generating the certain voltage so that a voltage drop on the voltage node is less than the supply voltage when the first logic control phase is active.

6. A method according to claim 5, wherein the first and second logic control phases are not active at a same time.

7. A method according to claim 5, wherein the fifth switch charges the second plate of the boost capacitor when connected to the control terminal of the sampling switch.

8. A method according to claim 5, wherein the certain voltage is an inverted replica of the second logic control phase.

9. A method according to claim 5, wherein the reference voltage is an inverted replica of the second logic control phase.

10. A method according to claim 5, wherein the fourth and sixth switches each comprise NMOS transistors, the fifth switch comprises a PMOS transistor.

11. A boosted sampling circuit comprising:
an input node and an output node;
a sampling switch connected to the input node for sampling an input voltage and for generating a corresponding sampled voltage on the output node, said sampling switch comprising a control terminal; and a control circuit for generating a control voltage for said sampling switch as a function of the input voltage, said control circuit comprising
a boost capacitor comprising first and second plates,
second and third switches for alternately charging the first plate of said boost capacitor with the input voltage and with a reference voltage, said second and third switches being respectively controlled by first and second logic control phases, the first and second logic control phases not being active at a same time,
fourth and fifth switches for alternately charging the second plate of said boost capacitor with a supply voltage, said fourth switch charging the second plate during a conduction state when the second logic control phase is active, and said fifth switch charging the second plate when connected to the control terminal of said sampling switch during a conduction state when the first logic control phase is active,
a sixth switch for turning off said sampling switch by connecting the control terminal thereof to a voltage node having a certain voltage being applied thereto, said sixth switch turning off said sampling switch during a conduction state when the second logic control phase is active, and
an input circuit for applying the input voltage to control terminals of said fourth, fifth and sixth switches when the first logic control phase is active, and for generating the certain voltage so that a voltage drop on the voltage node is less than the supply voltage when the first logic control phase is active.

12. A sampling circuit according to claim 11, wherein the certain voltage is an inverted replica of the second logic control phase.

13. A sampling circuit according to claim 11, wherein the reference voltage is an inverted replica of the second logic control phase.

14. A sampling circuit according to claim 11, wherein the control terminals of said fourth, fifth and sixth switches are connected to a common node, wherein said input circuit comprises:
a seventh switch for connecting the common node to a supply node during a conduction state when the second logic control phase is active; and
an eighth switch for connecting the common node to the input node, said eight switch being controlled by the first logic control phase.

15. A sampling circuit according to claim 14, wherein said fourth and sixth switches each comprise NMOS transistors, said fifth and seventh switches each comprise PMOS transistors, and said eighth switch comprises a pair of complementary MOS transistors.

16. A boosted sampling circuit comprising:
an input node and an output node;
a sampling switch connected to the input node for sampling an input voltage and for generating a corresponding sampled voltage on the output node, said sampling switch comprising a control terminal; and
a control circuit for generating a control voltage for said sampling switch as a function of the input voltage, said control circuit comprising
a boost capacitor comprising first and second plates,
second and third switches for alternately charging the first plate of said boost capacitor with the input voltage and with a reference voltage, said second and third switches being respectively controlled by first and second logic control phases, fourth and fifth switches for alternately charging the second plate of said boost capacitor with a supply voltage, said fourth switch charging the second plate during a conduction state when the second logic control phase is active, and said fifth switch charging the second plate during a conduction state when the first logic control phase is active, a sixth switch for turning off said sampling switch by connecting the control terminal thereof to a voltage node having a certain voltage being applied thereto, said sixth switch turning off said sampling switch during a conduction state when the second logic control phase is active, and an input circuit for applying the input voltage to control terminals of said fourth, fifth and sixth switches when the first logic control phase is active, and for generating the certain voltage so that a voltage drop on the voltage node is less than the supply voltage when the first logic control phase is active.

17. A sampling circuit according to claim 16, wherein the first and second logic control phases are not active at a same time.

18. A sampling circuit according to claim 16, wherein said fifth switch charges the second plate of said boost capacitor when connected to the control terminal of said sampling switch.

19. A sampling circuit according to claim 16, wherein the certain voltage is an inverted replica of the second logic control phase.

20. A sampling circuit according to claim 16, wherein the reference voltage is an inverted replica of the second logic control phase.

21. A sampling circuit according to claim 16, wherein the control terminals of said fourth, fifth and sixth switches are connected to a common node, wherein said input circuit comprises:

a seventh switch for connecting the common node to a supply node during a conduction state when the second logic control phase is active; and an eighth switch for connecting the common node to the input node, said eight switch being controlled by the first logic control phase.

22. A sampling circuit according to claim 21, wherein said fourth and sixth switches each comprise NMOS transistors, said fifth and seventh switches each comprise PMOS transistors, and said eighth switch comprises a pair of complementary MOS transistors.

* * * * *